(12) United States Patent
Ohta et al.

(10) Patent No.: US 11,189,777 B2
(45) Date of Patent: Nov. 30, 2021

(54) MULTILAYER PIEZOELECTRIC ELEMENT AND VIBRATING DEVICE

(71) Applicant: TDK CORPORATION, Tokyo (JP)

(72) Inventors: Yoshiki Ohta, Tokyo (JP); Tetsuyuki Taniguchi, Tokyo (JP); Hideya Sakamoto, Tokyo (JP); Kazushi Tachimoto, Tokyo (JP); Junpei Kikuchi, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 398 days.

(21) Appl. No.: 16/128,887

(22) Filed: Sep. 12, 2018

(65) Prior Publication Data

US 2019/0088851 A1  Mar. 21, 2019

(30) Foreign Application Priority Data

Sep. 20, 2017  (JP) .............................. JP2017-180087

(51) Int. Cl.
| | |
|---|---|
| H01L 41/08 | (2006.01) |
| H01L 41/083 | (2006.01) |
| H01L 41/277 | (2013.01) |
| H01L 41/09 | (2006.01) |
| H01L 41/047 | (2006.01) |
| H01L 41/053 | (2006.01) |

(52) U.S. Cl.
CPC ...... *H01L 41/0838* (2013.01); *H01L 41/0474* (2013.01); *H01L 41/0475* (2013.01); *H01L 41/053* (2013.01); *H01L 41/0986* (2013.01); *H01L 41/277* (2013.01)

(58) Field of Classification Search
CPC ............. H01L 41/0838; H01L 41/0474; H01L 41/0475; H01L 41/053; H01L 41/0986
USPC ......................................... 310/328, 365, 366
See application file for complete search history.

(56) References Cited

U.S. PATENT DOCUMENTS 5,381,385 A * 1/1995 Greenstein .............. B06B 1/064
 310/334
2003/0001931 A1  1/2003 Isono
(Continued)

FOREIGN PATENT DOCUMENTS

| JP | 2002-374685 A | 12/2002 |
|---|---|---|
| JP | 2005-354298 A | 12/2005 |

(Continued)

*Primary Examiner* — Derek J Rosenau
(74) *Attorney, Agent, or Firm* — Oliff PLC

(57) ABSTRACT

A multilayer piezoelectric element includes a piezoelectric element body, a first internal electrode and a second internal electrode, a plurality of first connecting conductors, a plurality of second connecting conductors, and an external member. The piezoelectric element body is formed by laminating a plurality of piezoelectric element body layer. The piezoelectric element body includes a first main surface and a second main surface, and a side surface. The plurality of first connecting conductors are connected to the first internal electrode. The plurality of second connecting conductors are connected to the second internal electrode. The external member is conductive and is bonded to the first main surface in such a way as to cover the first end portions of the plurality of first connecting conductors. The external member is electrically connected to the plurality of first connecting conductors.

13 Claims, 9 Drawing Sheets

(56) References Cited

U.S. PATENT DOCUMENTS

2004/0251784 A1* 12/2004 Kuniyasu ............ H01L 41/0474
310/328
2015/0311423 A1* 10/2015 Murakami .......... H01L 41/0475
310/366

FOREIGN PATENT DOCUMENTS

| JP | 2010-103977 A | 5/2010 |
| JP | 2015-162728 A | 9/2015 |
| JP | 2016-051895 A | 4/2016 |

* cited by examiner

Fig.3

MULTILAYER PIEZOELECTRIC ELEMENT AND VIBRATING DEVICE

TECHNICAL FIELD

An aspect of the present invention relates to a multilayer piezoelectric element and a vibrating device.

BACKGROUND

For example, Japanese Unexamined Patent Publication No. 2005-354298 describes a multilayer piezoelectric element including a piezoelectric element body, internal electrodes, a surface electrode, and via electrodes. This multilayer piezoelectric element is in a cantilevered type in which a first end portion thereof is held by a holding portion and has the via electrodes connected to the surface electrode disposed at the first end portion and a second end portion, respectively. Accordingly, even in a case where cracks are generated in the multilayer piezoelectric element due to shock, and in which the surface electrode is separated into the first and second end portion sides, electricity can be supplied to the first end portion side and the second end portion side of the surface electrode via the internal electrode and the via electrodes. Consequently, deterioration of piezoelectric characteristics can be restricted.

SUMMARY

In the above multilayer piezoelectric element, in a case where cracks are generated not only in the surface electrode but also in the internal electrode, deterioration of piezoelectric characteristics cannot be restricted.

An aspect of the present invention provides a multilayer piezoelectric element and a vibrating device enabling deterioration of piezoelectric characteristics caused by cracks to be restricted further.

A multilayer piezoelectric element according to an aspect of the present invention includes a piezoelectric element body, a first internal electrode and a second internal electrode, a plurality of first connecting conductors, a plurality of second connecting conductors, and an external member. The piezoelectric element body is formed by laminating a plurality of piezoelectric element body layer. The piezoelectric element body includes a first main surface and a second main surface, and a side surface. The first main surface and the second main surface are opposed to each other in a laminating direction of the plurality of piezoelectric element body layers. The side surface extends in the laminating direction in such a way as to connect the first main surface to the second main surface. The first internal electrode and the second internal electrode have different polarities from each other. The first internal electrode and the second internal electrode are disposed in the piezoelectric element body to be opposed to each other in the laminating direction. The plurality of first connecting conductors extend in the laminating direction and include first end portions exposed to the first main surface. The plurality of first connecting conductors are connected to the first internal electrode. The plurality of second connecting conductors extend in the laminating direction and include second end portions exposed to the second main surface. The plurality of second connecting conductors are connected to the second internal electrode. The external member is conductive and is bonded to the first main surface in such a way as to cover the first end portions of the plurality of first connecting conductors. The external member is electrically connected to the plurality of first connecting conductors.

In the multilayer piezoelectric element according to the aspect of the present invention, the first internal electrode and the second internal electrode are disposed in the piezoelectric element body. The plurality of first connecting conductors include the first end portions exposed to the first main surface and are connected to the first internal electrode. The plurality of second connecting conductors include the second end portions exposed to the second main surface and are connected to the second internal electrode. The external member is conductive, is bonded to the first main surface in such a way as to cover the first end portions of the plurality of first connecting conductors, and is electrically connected to the plurality of first connecting conductors. Accordingly, even in a case where cracks are generated in the piezoelectric element body, and in which the first internal electrode is separated, electricity can be supplied to the respective separated parts of the first internal electrode through the external member and the plurality of first connecting conductors by employing a configuration in which breakage due to cracks is hard to be generated in the external member. Consequently, deterioration of piezoelectric characteristics can be restricted.

In the multilayer piezoelectric element according to the aspect of the present invention, the second main surface may be an mounting surface to be mounted on a conductive vibrating plate. The second end portions of the plurality of second connecting conductors may electrically be connected to each other via the vibrating plate. In this case, even in a case where cracks are generated in the piezoelectric element body, and in which the second internal electrode is separated, electricity can be supplied to the respective separated parts of the second internal electrode through the vibrating plate and the plurality of second connecting conductors. Consequently, deterioration of piezoelectric characteristics can further be restricted.

The multilayer piezoelectric element according to the aspect of the present invention may further include a first external electrode configured to be disposed on the first main surface and be connected to the first end portions of the plurality of first connecting conductors. The external member may be bonded to the first main surface via the first external electrode. The external member may electrically be connected to the plurality of first connecting conductors via the first external electrode. In this case, a connection failure can be restricted further than in a case where the first connecting conductors and the external member are directly connected.

The multilayer piezoelectric element according to the aspect of the present invention may further include a second external electrode configured to be disposed on the second main surface and be connected to the second end portions of the plurality of second connecting conductors. In this case, the plurality of second connecting conductors can electrically be connected to each other by the second external electrode.

In the multilayer piezoelectric element according to the aspect of the present invention, the second external electrode may include a round corner as seen from the laminating direction. In this case, for example, even in a case where an active region is formed between the second external electrode and the first internal electrode, and in which the outer edge of the first external electrode becomes a boundary between the active region and the inactive region, stress caused by displacement at the time of driving can be restricted from concentrating on the corner part of the second external electrode. Consequently, cracks in the piezoelectric element body can be restricted.

In the multilayer piezoelectric element according to the aspect of the present invention, each of the plurality of first connecting conductors or each of the plurality of second connecting conductors may include a via conductor penetrating one of the plurality of piezoelectric element body layers. In this case, the first connecting conductor or the second connecting conductor is less likely to be shorted than in a case where the first connecting conductor or the second connecting conductor includes a side electrode disposed on the side surface of the piezoelectric element body, for example.

In the multilayer piezoelectric element according to the aspect of the present invention, each of the plurality of first connecting conductors or each of the plurality of second connecting conductors may include a via conductor group including a plurality of via conductors penetrating one of the plurality of piezoelectric element body layers. In this case, each of the via conductors can be reduced in diameter compared to a case of providing one via conductor. Accordingly, since the contraction amount of the via conductors at the time of firing is reduced, disconnection of the via conductors can be restricted.

In the multilayer piezoelectric element according to the aspect of the present invention, the plurality of via conductors may be disposed in a matrix form as seen from the laminating direction. In this case, extension of cracks along the arrangement of the plurality of via conductors is restricted further than in a case where the plurality of via conductors are disposed in line.

In the multilayer piezoelectric element according to the aspect of the present invention, the piezoelectric element body may be formed in a rectangular solid shape. The first connecting conductor and the second connecting conductor may be disposed at each of corner portions of the piezoelectric element body as seen from the laminating direction. In this case, the plurality of first connecting conductors can be disposed to be distributed, and the plurality of second connecting conductors can be disposed to be distributed. Consequently, even in a case where the first internal electrode and the second internal electrode are separated by cracks, the respective separated parts are highly possibly connected to any of the first connecting conductors and the second connecting conductors unlike in a case where the plurality of first connecting conductors and the plurality of second connecting conductors are disposed together at the center portion of the piezoelectric element body as seen from the laminating direction, for example. Accordingly, deterioration of piezoelectric characteristics can effectively be restricted.

A vibrating device according to an aspect of the present invention includes the multilayer piezoelectric element and a vibrating plate configured to have the multilayer piezoelectric element mounted thereon, and the second main surface and the vibrating plate are opposed to each other.

Since the vibrating device according to the aspect of the present invention includes the multilayer piezoelectric element, deterioration of piezoelectric characteristics due to cracks can further be restricted.

The vibrating device according to the aspect of the present invention may further include a resin layer configured to cover the side surface. In this case, generation of cracks can be restricted.

BRIEF DESCRIPTION OF THE DRAWINGS

FIG. 3 is a cross-sectional view along the line III-III in FIG. 1;

DETAILED DESCRIPTION

Figure 1:
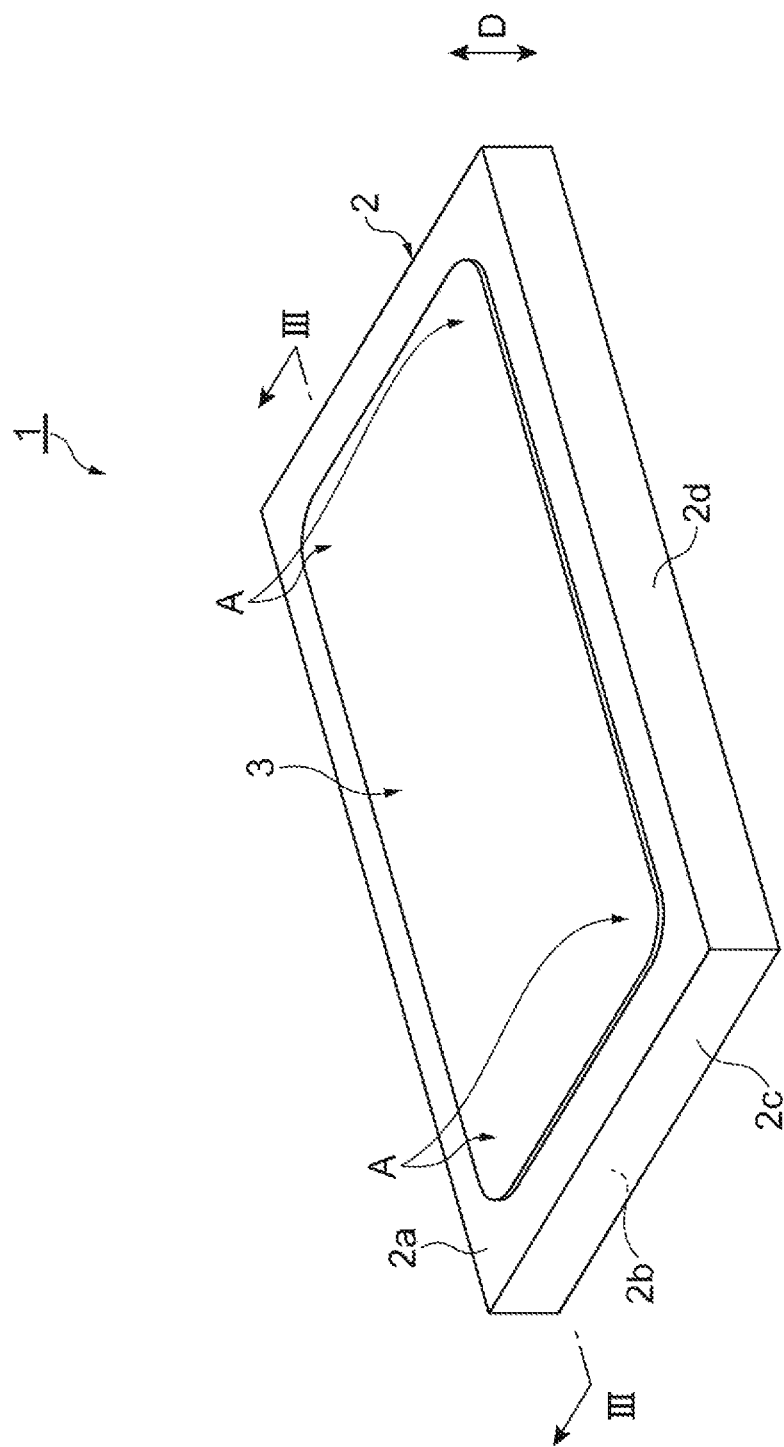
FIG. 1 is a perspective view illustrating a piezoelectric element according to an embodiment.

Embodiments of the present invention will be described with reference to the drawings. The following embodiments are illustrative only to describe the present invention and are not intended to limit the present invention to the following contents. In the description, similar components or components having similar functions are shown with the same reference numerals, and duplicate description is omitted.

Figure 2:
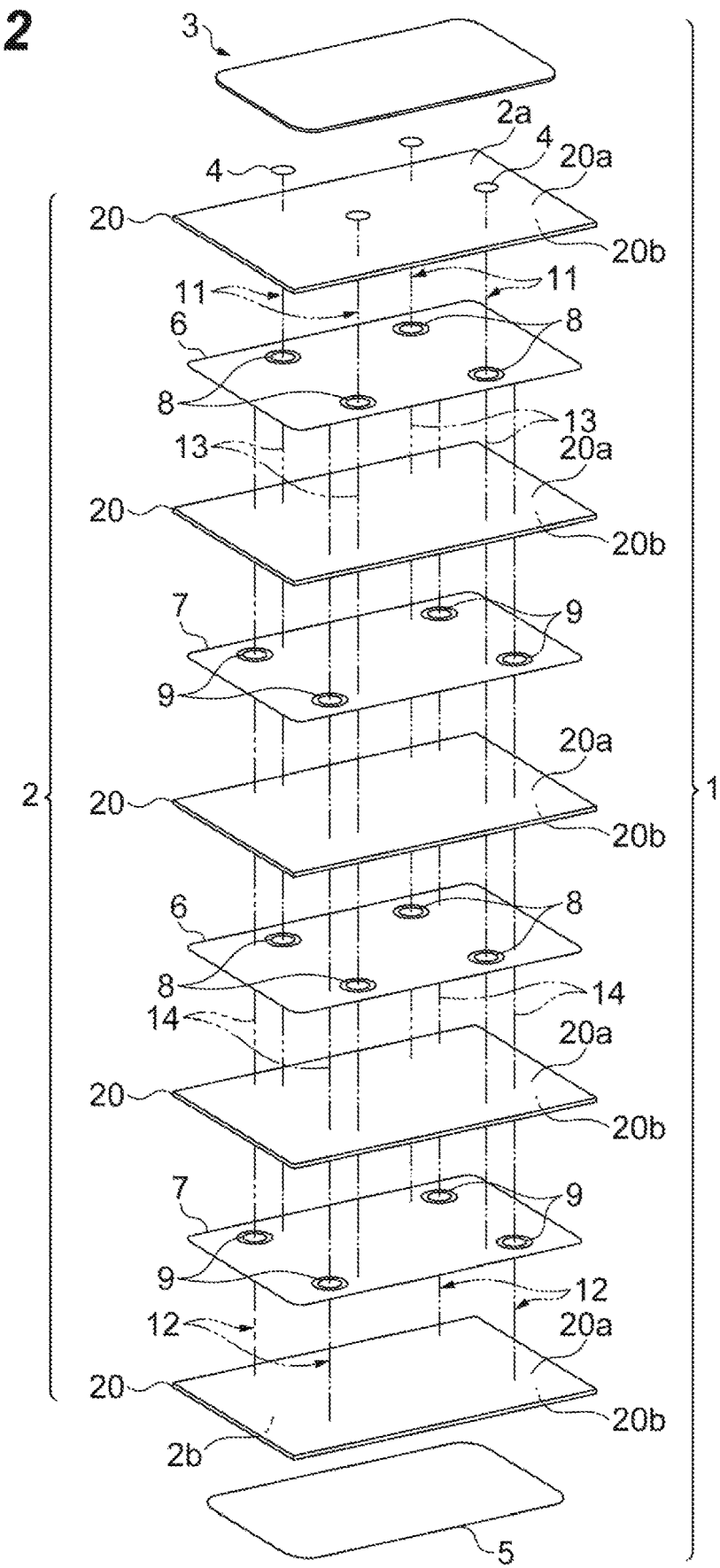
FIG. 2 is an exploded perspective view illustrating the piezoelectric element in FIG. 1.
Figure 3:
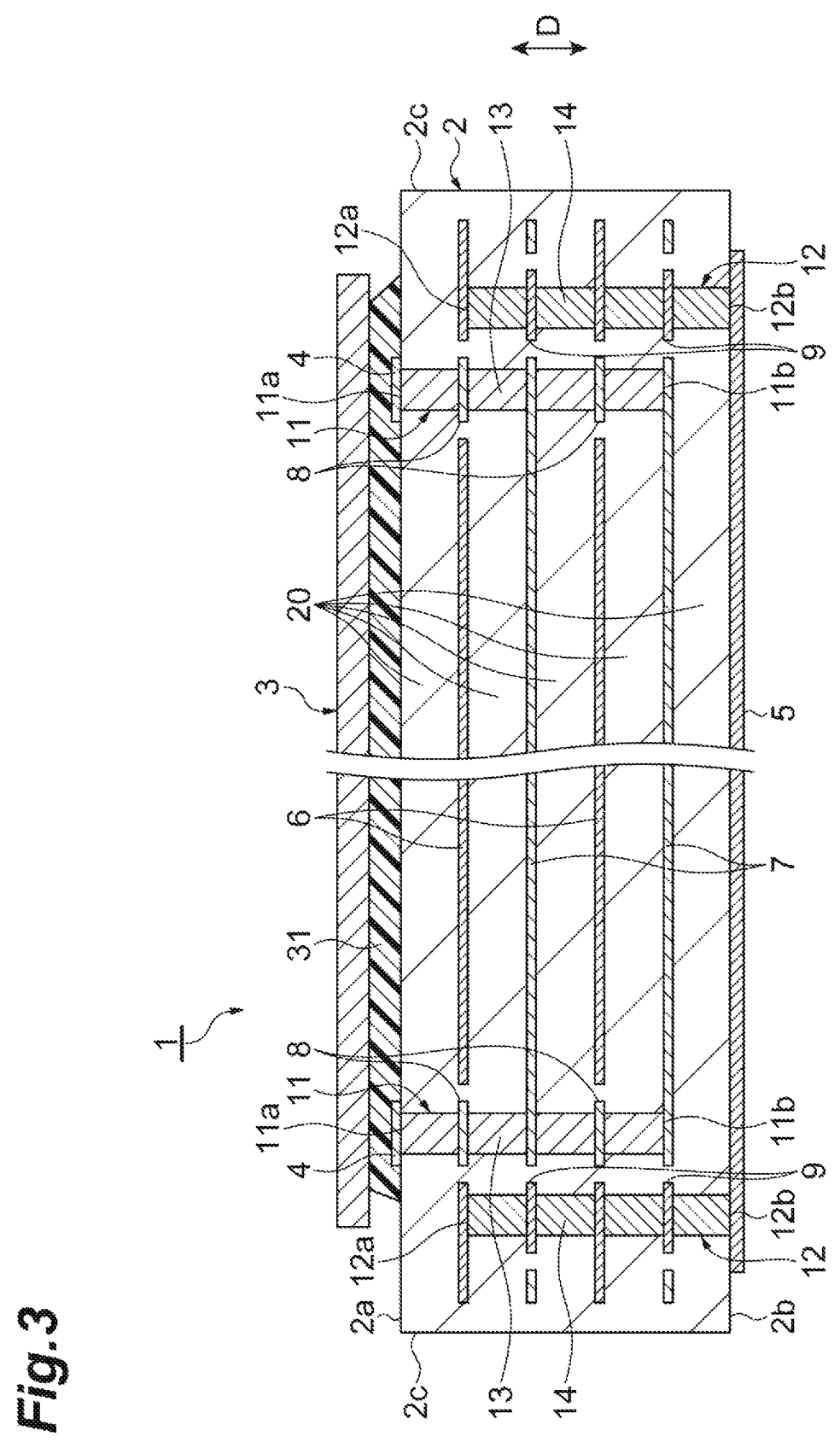
Figure 4:
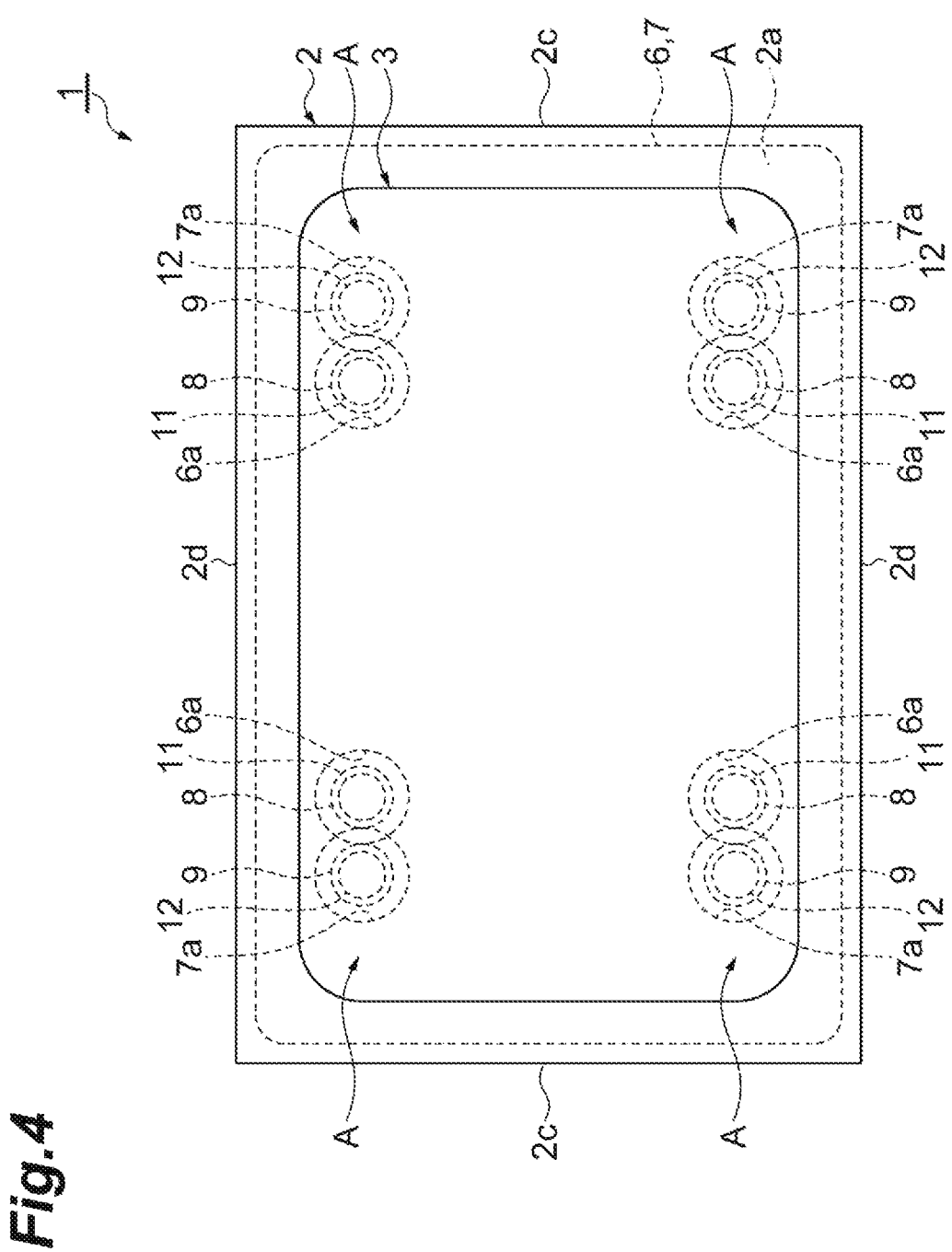
FIG. 4 is an upper view illustrating the piezoelectric element in FIG. 1.

FIG. 1 is a perspective view illustrating a piezoelectric element according to an embodiment. FIG. 2 is an exploded perspective view illustrating the piezoelectric element in FIG. 1. FIG. 3 is a cross-sectional view along the line III-III in FIG. 1. FIG. 4 is an upper view illustrating the piezoelectric element in FIG. 1. As illustrated in FIGS. 1 to 4, a piezoelectric element 1 includes a piezoelectric element body 2, an external member 3, a plurality of external electrodes 4, an external electrode 5, an internal electrode 6, an internal electrode 7, a plurality of connecting electrodes 8, a plurality of connecting electrodes 9, a plurality of connecting conductors 11, and a plurality of connecting conductors 12. The piezoelectric element 1 is a so-called multilayer piezoelectric element. In FIG. 4, the internal electrodes 6 and 7, the plurality of connecting electrodes 8 and 9, and the plurality of connecting conductors 11 and 12 are shown with dashed lines.

The piezoelectric element body 2 is formed in a rectangular solid shape. The piezoelectric element body 2 includes a pair of main surfaces 2a and 2b opposed to each other, a pair of side surfaces 2c opposed to each other, and a pair of side surfaces 2d opposed to each other. Each of the paired main surfaces 2a and 2b, the paired side surfaces 2c, and the paired side surfaces 2d is formed in a rectangular shape. The paired side surfaces 2c extend in a direction in which the paired main surfaces 2a and 2b are opposed in such a way as to connect the main surface 2a to the main surface 2b. The paired side surfaces 2d extend in the direction in which the paired main surfaces 2a and 2b are opposed in such a way as to connect the main surface 2a to the main surface 2b. The direction in which the paired main surfaces 2a and 2b are opposed, a direction in which the paired side surfaces 2c are opposed, and a direction in which the paired side surfaces 2d are opposed are perpendicular to each other. For example, in a case where the piezoelectric element 1 is used in a vibrating device 10, the main surface 2b is an mounting surface (a surface opposed to a vibrating plate 50 (refer to FIG. 5) and attached to the vibrating plate 50 when the piezoelectric element 1 is mounted on the vibrating plate 50)

mounted on the vibrating plate 50. The corner portions and the edge portions of the piezoelectric element body 2 may be chamfered or rounded.

The thickness (the length in the direction in which the paired main surfaces 2a and 2b are opposed) of the piezoelectric element body 2 is longer than 0.1 mm and is 0.2 mm, for example. The length (the length in the direction in which the paired side surfaces 2c are opposed) of the piezoelectric element body 2 is 20 mm, for example. The width (the length in the direction in which the paired side surfaces 2d are opposed) of the piezoelectric element body 2 is 10 mm, for example. The piezoelectric element body 2 includes four corner portions A as seen from the direction in which the paired main surfaces 2a and 2b are opposed. The corner portions A are regions which are separated by a distance of more than 20% of the length of the piezoelectric element body 2 away from the center in the direction in which the paired side surfaces 2c are opposed as seen from the laminating direction D. The corner portions A are regions which are separated by a distance of more than 20% of the width of the piezoelectric element body 2 away from the center in the direction in which the paired side surfaces 2d are opposed as seen from the laminating direction D.

The piezoelectric element body 2 includes a piezoelectric ceramic material (piezoelectric material). Examples of the piezoelectric ceramic material are PZT [Pb (Zr, Ti) $O_3$], PT ($PbTiO_3$), PLZT [(Pb, La) (Zr, Ti) $O_3$], barium titanate ($BaTiO_3$), BNT (bismuth sodium titanate), and KNN (potassium sodium niobate).

The piezoelectric element body 2 is formed by laminating a plurality of (five in the present embodiment) piezoelectric element body layers 20 along the direction in which the paired main surfaces 2a and 2b are opposed. That is, the direction in which the paired main surfaces 2a and 2b are opposed corresponds to the laminating direction D of the plurality of piezoelectric element body layers 20. The paired main surfaces 2a and 2b are opposed to each other in the laminating direction D. Each of the piezoelectric element body layers 20 is formed in a rectangular shape and includes a pair of main surfaces 20a and 20b opposed to each other in the laminating direction D.

The main surface 2a of the piezoelectric element body 2 is constituted by the main surface 20a of the piezoelectric element body layer 20 disposed at a first end in the laminating direction D (hereinbelow referred to as "a first end piezoelectric element body layer 20" as well) out of the plurality of piezoelectric element body layers 20. The main surface 2b of the piezoelectric element body 2 is constituted by the main surface 20b of the piezoelectric element body layer 20 disposed at a second end in the laminating direction D (hereinbelow referred to as "a second end piezoelectric element body layer 20" as well) out of the plurality of piezoelectric element body layers 20. The piezoelectric element body layer 20 includes a fired body of a ceramic green sheet containing the aforementioned piezoelectric ceramic material, for example. In the actual piezoelectric element body 2, the piezoelectric element body layers 20 are integrated in such a way that no boundaries between the layers can visually be recognized.

The external member 3 is formed in a rectangular shape, for example. The external member 3 is smaller than the main surface 2a as seen from the laminating direction D. For this reason, displacement of the piezoelectric element body 2 is hard to be constrained by the external member 3. The external member 3 is away from the outer edge of the main surface 2a as seen from the laminating direction D. For this reason, the external member 3 is hard to come off of the main surface 2a. The external member 3 is smaller than the internal electrode 6 and the internal electrode 7 as seen from the laminating direction D. Accordingly, in a case where the internal electrode 6 and the internal electrode 7 can be seen through the piezoelectric element body layers 20 because the piezoelectric element body layers 20 are thin, for example, positioning of the external member 3 can be performed easily when the external member 3 is to be provided on the main surface 2a. The external member 3 is away from the outer edges of the internal electrode 6 and the internal electrode 7 as seen from the laminating direction D. The external member 3 includes round corners at the respective corner portions A. The round corner means a curved corner formed by connecting the end portions of two straight lines in a curve, not a corner formed by intersecting two straight lines. Each of the round corners of the external member 3 as seen from the laminating direction D is a curved corner formed by connecting the end portions of two straight lines along, among the outer edges of the external member 3, the outer edge of the main surface 2a in a curve.

The external member 3 is bonded to the main surface 2a by means of adhesion or the like in such a way as to cover end portions 11a of the plurality of connecting conductors 11 and the plurality of external electrodes 4. In the present embodiment, the piezoelectric element 1 includes a bonding member 31 made of epoxy resin or acrylic resin, for example, and bonding the main surface 2a of the piezoelectric element body 2 to the external member 3. The external member 3 is bonded to the main surface 2a by means of adhesion. The external member 3 is bonded to the main surface 2a via the plurality of external electrodes 4. The external member 3 is conductive and is electrically connected to the plurality of connecting conductors 11 via the plurality of external electrodes 4.

The external member 3 is plastically deformed more easily than the piezoelectric element body 2 and includes stainless steel (SUS), an inver material (Ni—Mn—Fe), an FeNi alloy, brass, Al, Cu, or a printed board, for example. The external member 3 may be made of a material having a lower expansion coefficient. In a case where the external member 3 is a printed board, the printed board only needs to be conductive by including a conductor part electrically connecting the plurality of connecting conductors 11 to each other. The thickness (the length in the laminating direction D) of the external member 3 is shorter than the thickness (the length in the laminating direction D) of the piezoelectric element body 2. The thickness is 0.1 mm or shorter, for example. For this reason, the external member 3 is hard to constrain displacement of the piezoelectric element body 2. The thickness of the external member 3 is 0.03 mm or longer, for example. For this reason, in the external member 3, breakage due to cracks is hard to be generated.

The plurality of (four in the present embodiment) external electrodes 4 are disposed on the main surface 2a in such a way as to cover the end portions 11a of the plurality of (four in the present embodiment) connecting conductors 11. The plurality of external electrodes 4 are connected to the end portions 11a. The external electrodes 4 are disposed between the main surface 2a and the external member 3. The plurality of external electrodes 4 are formed in equal shapes to each other as seen from the laminating direction D, for example. The external electrodes 4 are formed in circular shapes as seen from the laminating direction D, for example. The external electrodes 4 are disposed at the respective corner portions A.

The external electrode 5 is disposed on the main surface 2b in such a way as to cover end portions 12b of the plurality of connecting conductors 12. The external electrode 5 is connected to the end portions 12b. In a case where the piezoelectric element 1 is mounted on the vibrating plate 50 (refer to FIG. 5), the external electrode 5 is disposed between the main surface 2b and the vibrating plate 50. The external electrode 5 is formed in a rectangular shape as seen from the laminating direction D, for example. The external electrode 5 is smaller than the main surface 2b and is away from the outer edge of the main surface 2b as seen from the laminating direction D. For this reason, for example, in a case where the piezoelectric element 1 is mounted on the vibrating plate 50 with use of conductive paste, a space between a region in the main surface 2b provided with no external electrode 5 and the vibrating plate 50 functions as a resin rich area accommodating excessive conductive paste. Accordingly, since the conductive paste is restricted from extending to the side surfaces 2c and the side surfaces 2d, short circuit can be restricted from occurring. The outer edge of the external electrode 5 is provided along the outer edge of the main surface 2b as seen from the laminating direction D. The external electrode 5 is smaller than the internal electrode 6 and the internal electrode 7 and is away from the outer edges of the internal electrode 6 and the internal electrode 7 as seen from the laminating direction D. The external electrode 5 includes round corners at the respective corner portions A.

The external electrodes 4 and 5 are made of a conductive material. Examples of the conductive material are an AgPd alloy, Ag, Pd, Cu, Au, and Pt. The conductive material is arbitrarily selected in accordance with the material for forming the piezoelectric element body 2. Each of the external electrodes 4 and 5 forms a fired body of conductive paste containing the aforementioned conductive material. The thickness (the length in the laminating direction D) of each of the external electrodes 4 and 5 is 1 μm or longer and 5 μm or shorter, for example.

The internal electrode 6 and the internal electrode 7 are opposed to each other in the laminating direction D and are disposed in the piezoelectric element body 2. The internal electrode 6 and the internal electrode 7 are layered between the first end piezoelectric element body layer 20 and the second end piezoelectric element body layer 20 with another piezoelectric element body layer 20 interposed therebetween. In the present embodiment, the piezoelectric element 1 includes a pair of internal electrodes 6 and a pair of internal electrodes 7, and the internal electrode 6 and the internal electrode 7 are layered twice alternately in this order from a side on which the first end piezoelectric element body layer 20 is located. The internal electrode 6 and the internal electrode 7 have different polarities from each other. The piezoelectric element 1 may include at least one internal electrode 6 and one internal electrode 7.

The internal electrode 6 and the internal electrode 7 are formed in rectangular shapes as seen from the laminating direction D, for example. The internal electrode 6 and the internal electrode 7 are away from the side surfaces 2c and the side surfaces 2d and are provided along the side surfaces 2c and the side surfaces 2d as seen from the laminating direction D. The internal electrode 6 and the internal electrode 7 are away from the side surfaces 2c and the side surfaces 2d by 20 μm or longer, for example. The internal electrode 6 and the internal electrode 7 include round corners at the respective corner portions A. The internal electrode 6 is provided with a plurality of (four in the present embodiment) through holes 6a. Each of the through holes 6a is provided at each of the corner portions A. The plurality of through holes 6a are formed in equal shapes to each other as seen from the laminating direction D, for example. The internal electrode 7 is provided with a plurality of (four in the present embodiment) through holes 7a. Each of the through holes 7a is provided at each of the corner portions A. The plurality of through holes 7a are formed in equal shapes to each other as seen from the laminating direction D, for example. The through holes 6a and the through holes 7a are formed in circular shapes as seen from the laminating direction D, for example.

The plurality of (four in the present embodiment) connecting electrodes 8 are disposed in an equal layer to the internal electrode 6 in the piezoelectric element body 2. The connecting electrodes 8 are disposed in the through holes 6a. The plurality of connecting electrodes 8 are formed in equal shapes to each other as seen from the laminating direction D, for example. The connecting electrodes 8 are formed in circular shapes as seen from the laminating direction D, for example. Each of the connecting electrodes 8 is concentric with the through hole 6a and is formed in a circular shape having a shorter diameter than that of the through hole 6a as seen from the laminating direction D. Accordingly, the internal electrode 6 and the plurality of connecting electrodes 8 disposed in the equal layer are away from each other as seen from the laminating direction D and are electrically insulated from each other. The connecting electrodes 8 are formed in equal shapes to those of the external electrodes 4 as seen from the laminating direction D, for example.

The plurality of (four in the present embodiment) connecting electrodes 9 are disposed in an equal layer to the internal electrode 7 in the piezoelectric element body 2. The connecting electrodes 9 are disposed in the through holes 7a. The plurality of connecting electrodes 9 are formed in equal shapes to each other as seen from the laminating direction D, for example. The connecting electrodes 9 are formed in circular shapes as seen from the laminating direction D, for example. Each of the connecting electrodes 9 is concentric with the through hole 7a and is formed in a circular shape having a shorter diameter than that of the through hole 7a as seen from the laminating direction D. Accordingly, the internal electrode 7 and the plurality of connecting electrodes 9 disposed in the equal layer are away from each other as seen from the laminating direction D and are electrically insulated from each other.

Particularly as illustrated in FIG. 4, the through hole 6a and the through hole 7a at each of the corner portions A are provided in such a way as to partially overlap with each other as seen from the laminating direction D. The through hole 6a, and the connecting electrode 9 and the connecting conductor 12, at each of the corner portions A, are provided in such a way as not to overlap with each other as seen from the laminating direction D. The through hole 7a, and the connecting electrode 8 and the connecting conductor 11, at each of the corner portions A, are provided in such a way as not to overlap with each other as seen from the laminating direction D. The connecting electrode 8 and the connecting conductor 11, and the external electrode 4, at each of the corner portions A, are provided in such a way as to overlap with each other as seen from the laminating direction D.

The internal electrode 6, the internal electrode 7, the plurality of connecting electrodes 8, and the plurality of connecting electrodes 9 are made of a conductive material. Examples of the conductive material are an AgPd alloy, Ag, Pd, Cu, Au, and Pt. The conductive material is arbitrarily selected in accordance with the material for forming the piezoelectric element body 2. Each of the internal electrode 6, the internal electrode 7, the plurality of connecting electrodes 8, and the plurality of connecting electrodes 9 forms a fired body of conductive paste containing the aforementioned conductive material. The thickness (the length in the laminating direction D) of each of the internal electrode 6, the internal electrode 7, the plurality of connecting electrodes 8, and the plurality of connecting electrodes 9 is 1 µm or longer and 5 µm or shorter, for example.

The plurality of (four in the present embodiment) connecting conductors 11 extend in the laminating direction D and are extracted from the internal electrode 7 to the main surface 2a. The plurality of connecting conductors 11 connect the internal electrode 7 to the main surface 2a. The connecting conductors 11 are disposed at the respective corner portions A. Each of the connecting conductors 11 includes an end portion 11a on a side on which the main surface 2a is located and an end portion 11b on a side on which the main surface 2b is located. The end portion 11a is exposed to the main surface 2a. The end portion 11a may be provided in an equal plane to that of the main surface 2a, protruded from the main surface 2a, or recessed from the main surface 2a. The end portion 11a is connected to the external electrode 4. The end portions 11a are thus electrically connected to each other on the main surface 2a. The end portion 11b is connected to the internal electrode 7 which is adjacent to the second end piezoelectric element body layer 20. Each of the connecting conductors 11 includes a plurality of (four in the present embodiment) via conductors 13 lining up in the laminating direction D. The plurality of via conductors 13 overlap with each other as seen from the laminating direction D. The via conductors 13 penetrate the piezoelectric element body layers 20. Specifically, the via conductors 13 penetrate the piezoelectric element body layers 20 other than the second end piezoelectric element body layer 20.

An end portion on the main surface 2a side of the via conductor 13, which is disposed closest to the main surface 2a out of the plurality of via conductors 13 (that is, the via conductor 13 penetrating the first end piezoelectric element body layer 20), constitutes the end portion 11a of the connecting conductor 11. An end portion on the main surface 2b side of the via conductor 13, which is disposed closest to the main surface 2b out of the plurality of via conductors 13, constitutes the end portion 11b of the connecting conductor 11. The paired via conductors 13 adjacent to each other in the laminating direction D are electrically connected to each other by the connecting electrode 8. Each of the via conductors 13 is concentric with the connecting electrode 8 and is formed in a circular shape having an equal or shorter diameter to or than that of the connecting electrode 8 as seen from the laminating direction D.

The plurality of (four in the present embodiment) connecting conductors 12 extend in the laminating direction D and are extracted from the internal electrode 6 to the main surface 2b. The plurality of connecting conductors 12 connect the internal electrode 6 to the main surface 2b. The connecting conductors 12 are disposed at the respective corner portions A. Each of the connecting conductors 12 includes an end portion 12a on a side on which the main surface 2a is located and an end portion 12b on a side on which the main surface 2b is located. The end portion 12a is connected to the internal electrode 6 which is adjacent to the first end piezoelectric element body layer 20. The end portion 12b is exposed to the main surface 2b. The end portion 12b may be provided in an equal plane to that of the main surface 2b, protruded from the main surface 2b, or recessed from the main surface 2b. The end portion 12b is connected to the external electrode 5. The end portions 12b are thus electrically connected to each other on the main surface 2b. Each of the connecting conductors 12 includes a plurality of (four in the present embodiment) via conductors 14 lining up in the laminating direction D. The plurality of via conductors 14 overlap with each other as seen from the laminating direction D. The via conductors 14 penetrate the piezoelectric element body layers 20. Specifically, the via conductors 14 penetrate the piezoelectric element body layers 20 other than the first end piezoelectric element body layer 20.

An end portion on the main surface 2a side of the via conductor 14, which is disposed closest to the main surface 2a out of the plurality of via conductors 14, constitutes the end portion 12a of the connecting conductor 12. An end portion on the main surface 2b side of the via conductor 14, which is disposed closest to the main surface 2b out of the plurality of via conductors 14 (that is, the via conductor 14 penetrating the second end piezoelectric element body layer 20), constitutes the end portion 12b of the connecting conductor 12. The paired via conductors 14 adjacent to each other in the laminating direction D are electrically connected to each other by the connecting electrode 9. Each of the via conductors 14 is concentric with the connecting electrode 9 and is formed in a circular shape having an equal or shorter diameter to or than that of the connecting electrode 9 as seen from the laminating direction D.

Particularly as illustrated in FIG. 4, the connecting conductor 11 and the connecting conductor 12 at each of the corner portions A are disposed in such a way as to be away from each other in a direction in which the paired side surfaces 2c are opposed as seen from the laminating direction D. At each of the corner portions A, the distance between the connecting conductor 11 and the side surface 2c is longer than the distance between the connecting conductor 12 and the side surface 2c. That is, the distance between the adjacent paired connecting conductors 11 in the direction in which the paired side surfaces 2c are opposed is shorter than the distance between the adjacent paired connecting conductors 12 in the direction in which the paired side surfaces 2c are opposed. At each of the corner portions A, the distance between the connecting conductor 11 and the side surface 2d is equivalent to the distance between the connecting conductor 12 and the side surface 2d.

Figure 5:
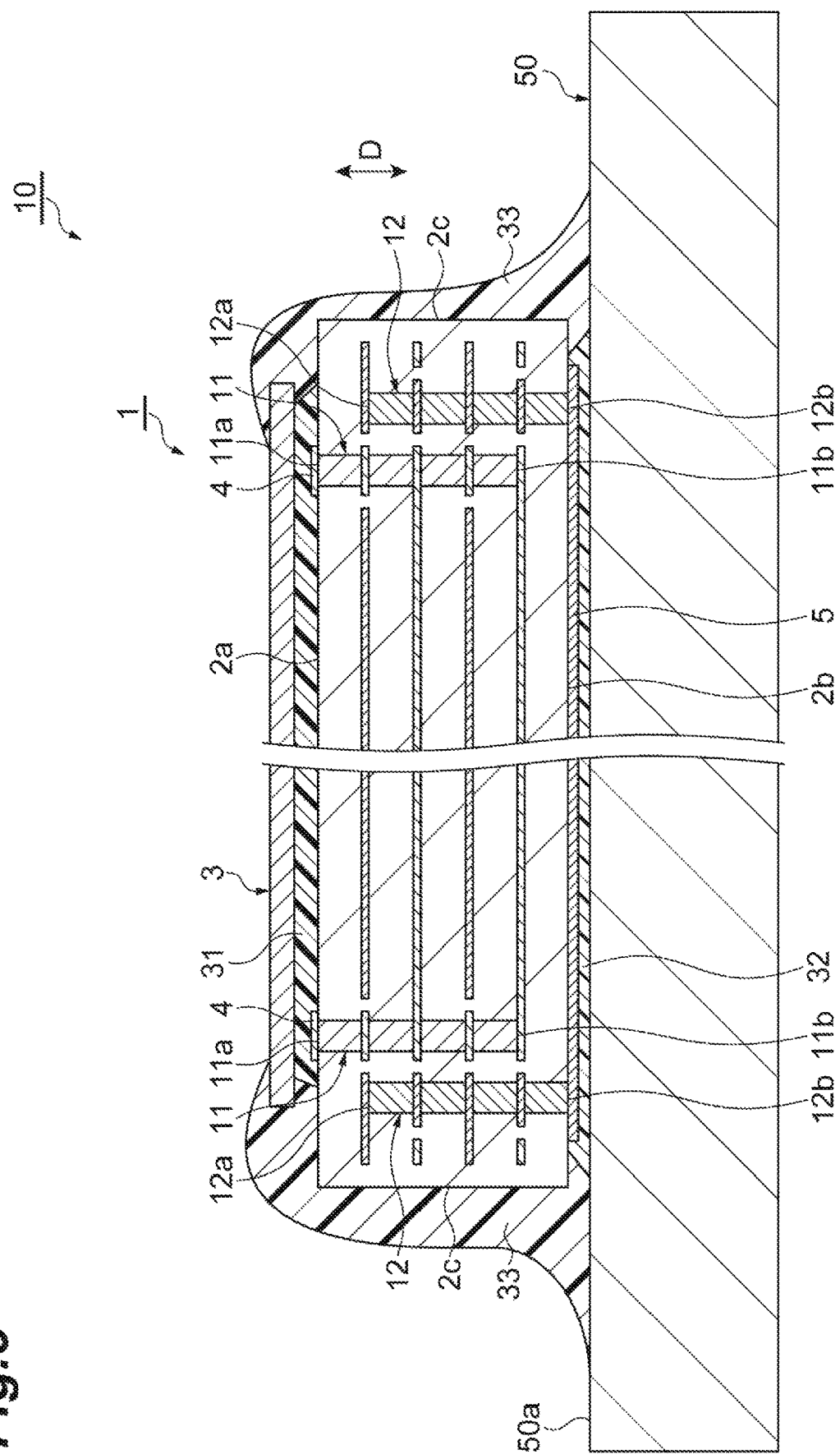
FIG. 5 is a cross-sectional view illustrating a vibrating device according to the embodiment.
Figure 6A:
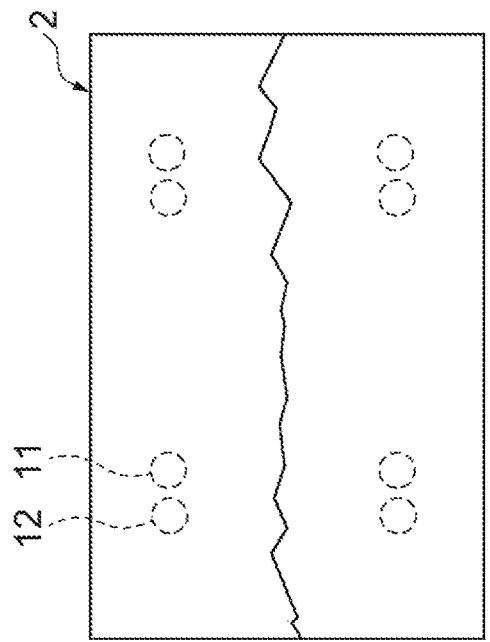
FIGS. 6A, 6B, 6C, and 6D are upper views illustrating examples of cracks in a piezoelectric element body.
Figure 6B:
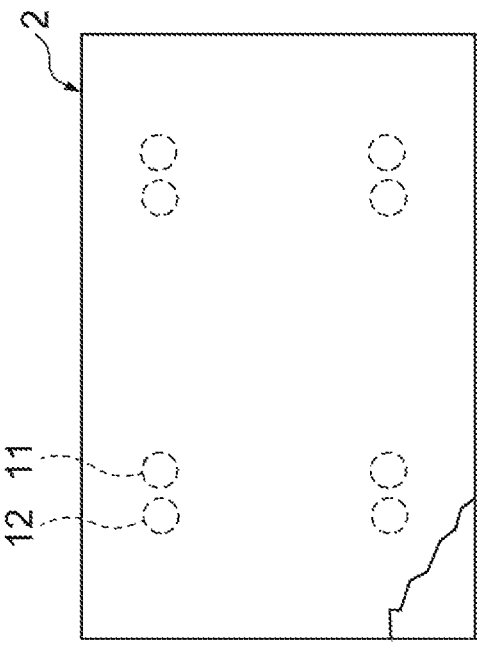
Figure 6C:
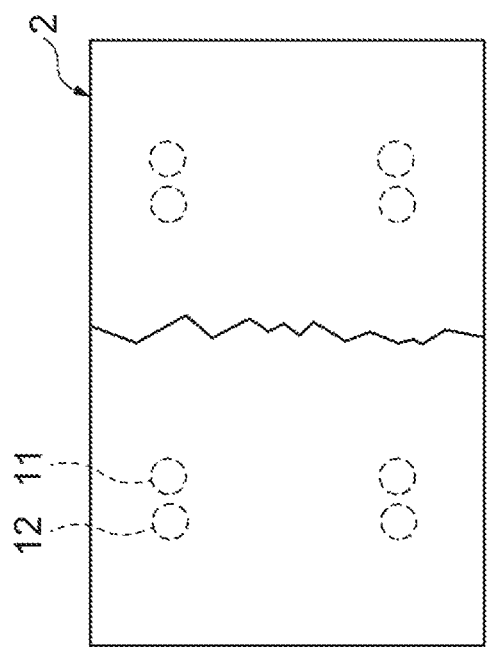
Figure 6D:
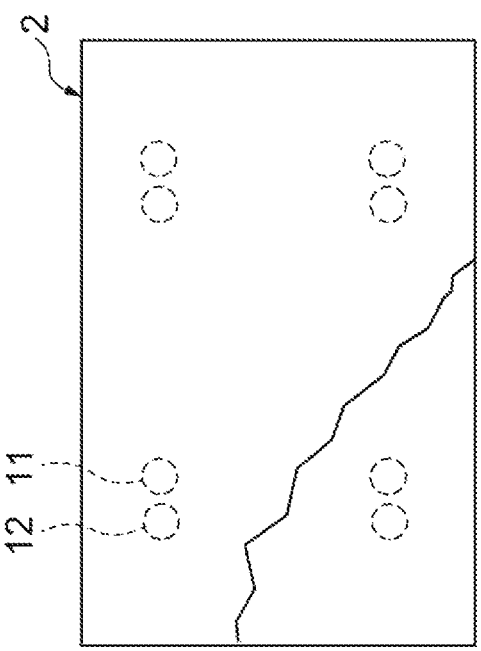

FIG. 5 is a cross-sectional view illustrating a vibrating device according to the embodiment. As illustrated in FIG. 5, the vibrating device 10 according to the embodiment includes the piezoelectric element 1, the vibrating plate 50, a bonding member 32, and a resin layer 33. The vibrating plate 50 is a plate member formed in a rectangular shape as seen from the laminating direction D, for example. On a main surface 50a of the vibrating plate 50, the piezoelectric element 1 is mounted. The main surface 50a is opposed to the main surface 2b serving as an mounting surface of the piezoelectric element 1. To the main surface 50a, the entire surface of the main surface 2b is bonded. The vibrating plate 50 includes glass, Ni, stainless steel (SUS), brass, an inver material (Ni—Mn—Fe), or a resin, for example. Examples of the resin forming the vibrating plate 50 are polyester, polyimide, PPS (polyphenylene sulfide), and an LCP (a liquid crystal polymer). The vibrating plate 50 according to the present embodiment is conductive. The vibrating plate 50 may include a glass plate and a conductive thin film made of Cu or the like provided on the glass plate. The thickness (the length in the laminating direction D) of the vibrating plate 50 is 0.1 mm or longer and 0.3 mm or shorter, for example.

The bonding member 32 bonds the piezoelectric element 1 to the vibrating plate 50. Specifically, the bonding member 32 bonds the main surface 2b and the external electrode 5 of the piezoelectric element 1 to the main surface 50a of the vibrating plate 50. The bonding member 32 is conductive and electrically connects the external electrode 5 to the vibrating plate 50. That is, the end portions 12b of the plurality of connecting conductors 12 are electrically connected to each other via the external electrode 5, the bonding member 32, and the vibrating plate 50. The bonding member 32 includes a conductive resin. The conductive resin contains a resin (for example, a thermally cured resin) and a conductive material (for example, metal powder). An example of the metal powder to be used is Ag powder. Examples of the thermally cured resin to be used are a phenol resin, an acrylic resin, a silicone resin, an epoxy resin, and a polyimide resin.

The resin layer 33 covers the pair of side surfaces 2c and the pair of side surfaces 2d (refer to FIG. 1) of the piezoelectric element 1. The resin layer 33 also covers a part of the main surface 2a exposed from the bonding member 31 and the external member 3 and a part of the main surface 2b exposed from the external electrode 5 and the bonding member 32. The resin layer 33 constitutes resin mold and seals the piezoelectric element 1 in such a way as to prevent anything other than the external member 3 from being exposed. The resin layer 33 contains no conductive material and is electrically insulated. The resin layer 33 includes a thermally cured resin such as an epoxy resin. The hardness of the resin layer 33 is lower than the hardness of the bonding member 31 and the bonding member 32. For this reason, displacement of the piezoelectric element 1 is hard to be constrained by the resin layer 33.

Next, an example of a method for manufacturing the piezoelectric element 1 and the vibrating device 10 will be described. First, PZT powder is turned into paint, and green sheets for the piezoelectric element body layers 20 are prepared by means of a doctor blade method. Subsequently, through holes are formed in the green sheets with use of YAG laser. Subsequently, electrode patterns for the internal electrodes 6 and 7 and the connecting electrodes 8 and 9 are formed on the green sheets, and the green sheets are layered. To form the electrode patterns, screen printing is performed with use of conductive paste prepared by mixing a conductive material with an organic binder, an organic solvent, or the like. Subsequently, the layered green sheets are subject to isostatic pressing for five minutes at 100 MPa at about 70° C. The layered green sheets are then debinded and fired into a layered body substrate. The debinding is performed at 450° C. for about twelve hours. The firing is performed at 1200° C. for three hours. Subsequently, conductive paste is applied to the layered body substrate by means of screen printing and is baked to form the external electrodes 4 and 5. Subsequently, the layered body substrate is polarized to prepare the piezoelectric element body 2. The polarization is performed for about ten minutes at 100° C. at 3.5 kV/mm. Subsequently, the external member 3 is bonded to the main surface 2a of the piezoelectric element body 2. As a result, the piezoelectric element 1 is obtained. In addition, the vibrating plate 50 is bonded to the main surface 2b of the piezoelectric element body 2. Subsequently, FPCs or lead wires are connected to the external member 3 and the vibrating plate 50, and the resin layer 33 is formed. As a result, the vibrating device 10 is obtained.

In the piezoelectric element 1, when voltage with different polarities is applied to the external member 3 and the external electrode 5, for example, an electric field is generated between the internal electrode 7 electrically connected to the external member 3 and the internal electrode 6 electrically connected to the external electrode 5. Since the external member 3 functions as an electrode, electric fields are generated between the external member 3 and the internal electrode 6 and between the external electrode 5 and the internal electrode 7. Consequently, a region in the first end piezoelectric element body layer 20 interposed between the external member 3 and the internal electrode 6, a region in the second end piezoelectric element body layer 20 interposed between the external electrode 5 and the internal electrode 7, and a region in another piezoelectric element body layer 20 interposed between the internal electrode 6 and the internal electrode 7 become active regions which are piezoelectrically active, and displacement is generated in the active regions. In a case where voltage to be applied is alternating voltage, the piezoelectric element 1 repeats contraction and expansion in accordance with the frequency of the alternating voltage.

In the vibrating device 10, the piezoelectric element 1 and the vibrating plate 50 are bonded to each other by the bonding member 32. Accordingly, the vibrating plate 50 performs flexural vibration integrally with the piezoelectric element 1 in accordance with the repetitive contraction and expansion of the piezoelectric element 1. In the vibrating device 10, the vibrating plate 50 functions as an electrode.

As described above, in the piezoelectric element 1 according to the present embodiment, the internal electrode 6 and the internal electrode 7 are disposed in the piezoelectric element body 2. The plurality of connecting conductors 11 include the end portions 11a exposed to the main surface 2a and are connected to the internal electrode 7. The plurality of connecting conductors 12 include the end portions 12b exposed to the main surface 2b and are connected to the internal electrode 6. The external member 3 is conductive, is bonded to the main surface 2a in such a way as to cover the end portions 11a of the connecting conductors 11, and is electrically connected to the plurality of connecting conductors 11. Accordingly, even in a case where cracks are generated in the piezoelectric element body 2, and in which the internal electrode 7 is separated, electricity can be supplied to the respective separated parts of the internal electrode 7 through the external member 3 and the plurality of connecting conductors 11 by employing a configuration in which breakage due to cracks is hard to be generated in the external member 3. Consequently, deterioration of piezoelectric characteristics can be restricted.

The main surface 2b is an mounting surface to be mounted on the conductive vibrating plate 50, and the end portions 12b of the plurality of connecting conductors 12 are electrically connected to each other via the vibrating plate 50. Accordingly, even in a case where cracks are generated in the piezoelectric element body 2, and in which the internal electrode 6 is separated, electricity can be supplied to the respective separated parts of the internal electrode 6 through the vibrating plate 50 and the plurality of connecting conductors 12. Consequently, deterioration of piezoelectric characteristics can further be restricted.

The piezoelectric element 1 includes the external electrodes 4. The external member 3 is bonded to the main surface 2a via the external electrodes 4 and is electrically connected to the plurality of connecting conductors 11 via the external electrodes 4. Accordingly, a connection failure can be restricted further than in a case where the connecting conductors 11 and the external member 3 are directly connected. Particularly, even in a case where the via conductors 13 of the connecting conductors 11 are contracted at the time of firing, and in which the connecting conductors 11 and the external member 3 cannot directly be connected, the external electrodes 4 enable the connecting conductors 11 and the external member 3 to be electrically connected.

The piezoelectric element 1 includes the external electrode 5, and the external electrode 5 is connected to the end portions 12b of the plurality of connecting conductors 12. Accordingly, the plurality of connecting conductors 12 can electrically be connected to each other by the external electrode 5. Particularly, even in a case where the via conductors 14 of the connecting conductors 12 are contracted at the time of firing, and in which the end portions 12b of the connecting conductors 12 are away from the main surface 2b, the external electrode 5 enables the plurality of connecting conductors 12 to be electrically connected to each other.

The external electrode 5 includes the round corners as seen from the laminating direction D. Accordingly, even in a case where an active region is formed between the external electrode 5 and the internal electrode 7, and in which the outer edge of the external electrode 5 becomes a boundary between the active region and the inactive region, stress caused by displacement at the time of driving can be restricted from concentrating on the corner parts of the external electrode 5. Consequently, cracks in the piezoelectric element body 2 can be restricted. In the piezoelectric element 1, the external member 3 functions as an electrode and includes the round corners as seen from the laminating direction D. Accordingly, even in a case where an active region is formed between the external member 3 and the internal electrode 6, and in which the outer edge of the external member 3 becomes a boundary between the active region and the inactive region, stress caused by displacement at the time of driving can be restricted from concentrating on the corner parts of the external member 3. Consequently, cracks in the piezoelectric element body 2 can further be restricted.

Each of the connecting conductors 11 includes the via conductors 13 penetrating the piezoelectric element body layers 20. Accordingly, the connecting conductor 11 is less likely to be shorted than in a case where the connecting conductor 11 includes a side electrode disposed on the side surface 2c or the side surface 2d, for example. Each of the connecting conductors 12 includes the via conductors 14 penetrating the piezoelectric element body layers 20. Accordingly, the connecting conductor 12 is less likely to be shorted than in a case where the connecting conductor 12 includes a side electrode disposed on the side surface 2c or the side surface 2d, for example.

The piezoelectric element body 2 is formed in a rectangular solid shape, and the connecting conductor 11 and the connecting conductor 12 are disposed at each of the corner portions A of the piezoelectric element body 2 as seen from the laminating direction D. Accordingly, the plurality of connecting conductors 11 can be disposed to be distributed, and the plurality of connecting conductors 12 can be disposed to be distributed. Consequently, even in a case where the internal electrodes 6 and 7 are separated by cracks, the respective separated parts are highly possibly connected to any of the connecting conductors 11 and 12 unlike in a case where the plurality of connecting conductors 11 and the plurality of connecting conductors 12 are disposed together at the center portion of the piezoelectric element body 2 as seen from the laminating direction D, for example. In a case where some of the separated parts are not connected to any of the connecting conductors 11 and 12, the active region decreases. However, in the piezoelectric element 1, such a decrease of the active region is restricted. Accordingly, deterioration of piezoelectric characteristics can effectively be restricted.

FIGS. 6A, 6B, 6C, and 6D are upper views illustrating examples of cracks in the piezoelectric element body. In FIGS. 6A, 6B, 6C, and 6D, the connecting conductors 11 and 12 are shown with dashed lines. In cases of the cracks illustrated in FIGS. 6A, 6B, and 6C, since the respective separated parts of the internal electrodes 6 and 7 (refer to FIG. 3) are connected to any of the connecting conductors 11 and 12, electricity can be supplied to the entire surfaces of the internal electrodes 6 and 7. Accordingly, active regions are formed by the entire surfaces of the internal electrodes 6 and 7. In a case of the crack illustrated in FIG. 6D, electricity cannot be supplied to parts of the internal electrodes 6 and 7 at the corner portion A (refer to FIG. 1) but can be supplied to the other parts, which form majorities of the internal electrodes 6 and 7. Accordingly, the majorities of the internal electrodes 6 and 7 form active regions.

Since the vibrating device 10 includes the piezoelectric element 1, deterioration of piezoelectric characteristics due to cracks can further be restricted. Since the vibrating device 10 includes the resin layer 33 covering the side surfaces 2c and the side surfaces 2d (refer to FIG. 1), generation of cracks can be restricted.

The present invention is not limited to the aforementioned embodiment and can be altered in various ways without departing from the scope thereof.

Figure 7:
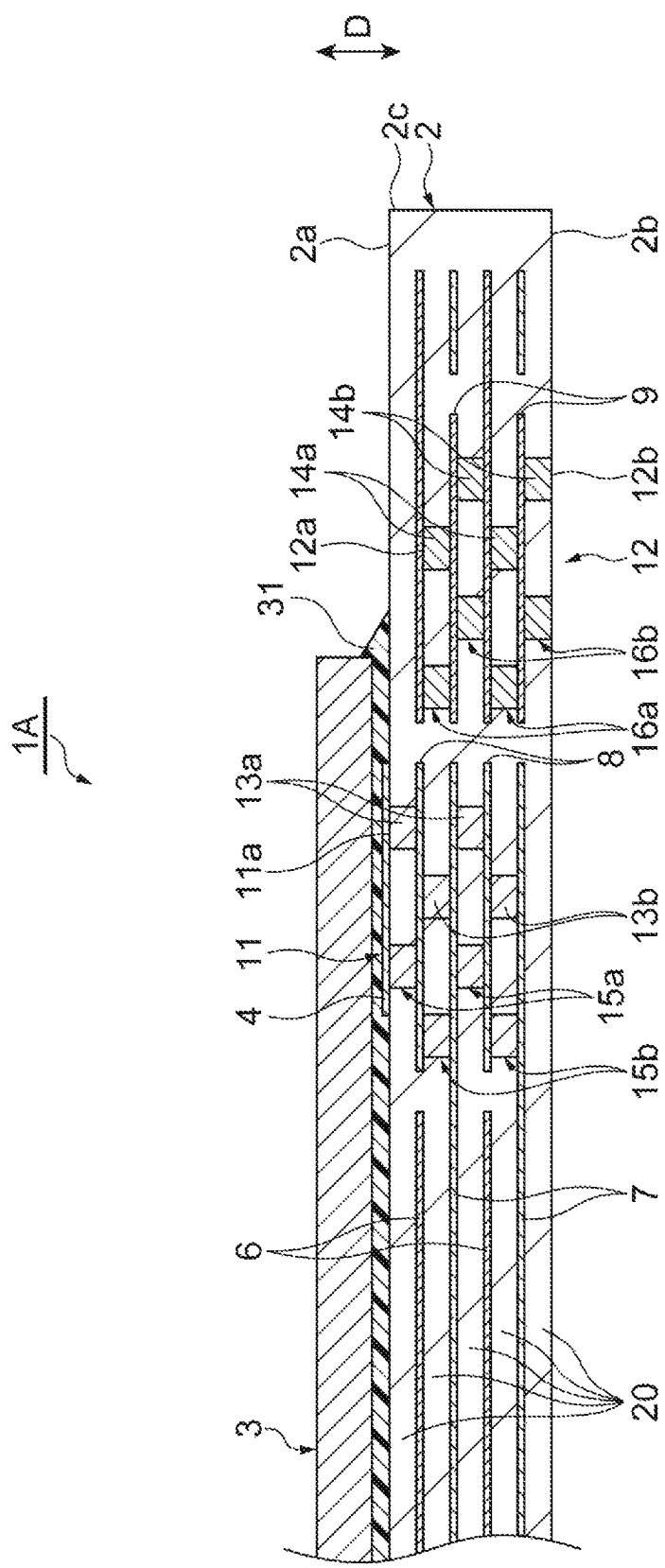
FIG. 7 is a cross-sectional view illustrating a piezoelectric element according to a modification example.
Figure 8:
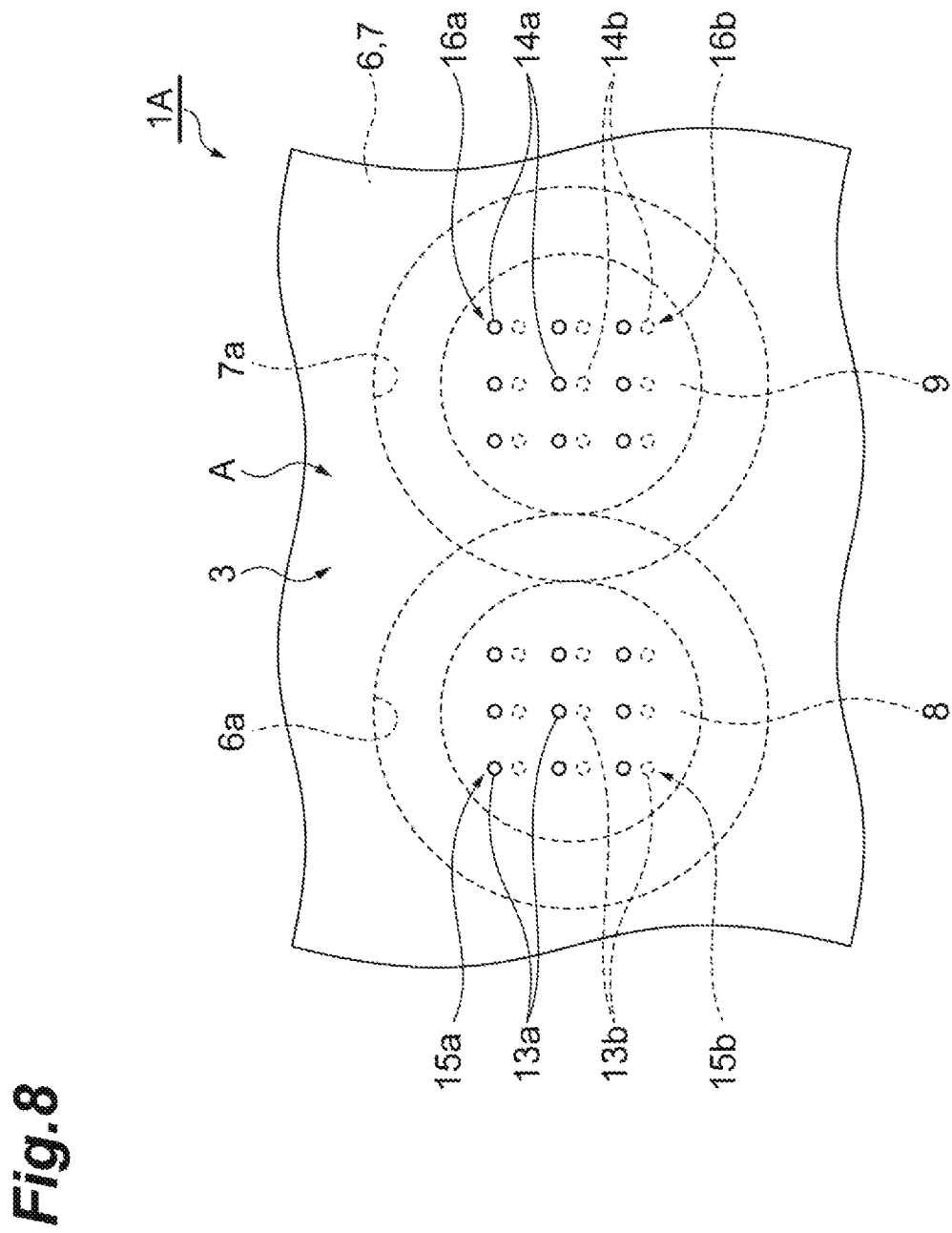
FIG. 8 is a partially enlarged upper view illustrating the piezoelectric element in FIG. 7.

FIG. 7 is a cross-sectional view illustrating a piezoelectric element according to a modification example. FIG. 8 is a partially enlarged upper view illustrating the piezoelectric element in FIG. 7. As illustrated in FIGS. 7 and 8, a piezoelectric element 1A according to the modification example mainly differs from the piezoelectric element 1 (refer to FIG. 3) in that each of the connecting conductors 11 includes a via conductor group 15a including a plurality of via conductors 13a and a via conductor group 15b including a plurality of via conductors 13b instead of the plurality of via conductors 13, in that each of the connecting conductors 12 includes a via conductor group 16a including a plurality of via conductors 14a and a via conductor group 16b including a plurality of via conductors 14b instead of the plurality of via conductors 14, and in that the external electrode 5 is not provided.

The via conductor group 15a is provided in the plurality of piezoelectric element body layers 20, except the second end piezoelectric element body layer 20, disposed at odd-numbered locations from the side on which the main surface 2a is provided (odd-numbered piezoelectric element body layers 20). The plurality of via conductors 13a penetrate the odd-numbered piezoelectric element body layers 20 except the second end piezoelectric element body layer 20. The via conductors 13a included in the different via conductor groups 15a are disposed in such a way as to overlap with each other as seen from the laminating direction D. The via conductor group 15b is provided in the plurality of piezoelectric element body layers 20 disposed at even-numbered locations from the side on which the main surface 2a is provided (even-numbered piezoelectric element body layers 20). The plurality of via conductors 13b penetrate the even-numbered piezoelectric element body layers 20. The via conductors 13b included in the different via conductor groups 15b are disposed in such a way as to overlap with each other as seen from the laminating direction D.

The via conductor group 16a is provided in the even-numbered piezoelectric element body layers 20 out of the plurality of piezoelectric element body layers 20. The plurality of via conductors 14a penetrate the even-numbered piezoelectric element body layers 20. The via conductors 14a included in the different via conductor groups 16a are disposed in such a way as to overlap with each other as seen from the laminating direction D. The via conductor group 16b is provided in the odd-numbered piezoelectric element body layers 20 out of the plurality of piezoelectric element body layers 20, except the first end piezoelectric element body layer 20. The plurality of via conductors 14b penetrate the odd-numbered piezoelectric element body layers 20 except the first end piezoelectric element body layer 20. The via conductors 14b included in the different via conductor groups 16b are disposed in such a way as to overlap with each other as seen from the laminating direction D.

The plurality of via conductors 13a are arrayed in a matrix form as seen from the laminating direction D. In the present modification example, nine via conductors 13a are arrayed in a matrix form of 3×3 (that is, three rows and three columns). In FIG. 7, illustration of the via conductors 13a is partially omitted. The plurality of via conductors 13a are arrayed at regular intervals, for example, as seen from the laminating direction D. The plurality of via conductors 13a are disposed at intersection positions of lattice lines drawn at regular intervals (that is, a square lattice), for example. All of the plurality of via conductors 13a are disposed in such a way as to overlap with the external electrode 4 and the connecting electrodes 8 as seen from the laminating direction D.

The plurality of via conductors 13b are arrayed in a matrix form as seen from the laminating direction D. In the present modification example, nine via conductors 13b are arrayed in a matrix form of 3×3 (that is, three rows and three columns). In FIG. 7, illustration of the via conductors 13b is partially omitted. The plurality of via conductors 13b are arrayed at regular intervals, for example, as seen from the laminating direction D. The plurality of via conductors 13b are disposed at intersection positions of lattice lines drawn at regular intervals (that is, a square lattice), for example. All of the plurality of via conductors 13b are disposed in such a way as to overlap with the external electrode 4 and the connecting electrodes 8 as seen from the laminating direction D.

The arraying distances of the plurality of via conductors 13a are equal to the arraying distances of the plurality of via conductors 13b. As described above, the plurality of via conductors 13a and the plurality of via conductors 13b are disposed in such a way as to be away from each other as seen from the laminating direction D. The plurality of via conductors 13a do not overlap with the plurality of via conductors 13b and are disposed at positions horizontally away from the plurality of via conductors 13b by ½ of the arraying distances in the row direction and in the column direction as seen from the laminating direction D. In this manner, the via conductors 13a and the via conductors 13b are not adjacent to each other in the laminating direction D. Accordingly, even in a case where the via conductors 13a and 13b are contracted at the time of firing, disconnection of the via conductors 13a and 13b is hard to occur compared to a case where the via conductors 13a and the via conductors 13b are adjacent to each other in the laminating direction D.

The plurality of via conductors 14a are arrayed in a matrix form as seen from the laminating direction D. In the present modification example, nine via conductors 14a are arrayed in a matrix form of 3×3 (that is, three rows and three columns). In FIG. 7, illustration of the via conductors 14a is partially omitted. The plurality of via conductors 14a are arrayed at regular intervals, for example, as seen from the laminating direction D. The plurality of via conductors 14a are disposed at intersection positions of lattice lines drawn at regular intervals (that is, a square lattice), for example. All of the plurality of via conductors 14a are disposed in such a way as to overlap with the connecting electrodes 9 as seen from the laminating direction D.

The plurality of via conductors 14b are arrayed in a matrix form as seen from the laminating direction D. In the present modification example, nine via conductors 14b are arrayed in a matrix form of 3×3 (that is, three rows and three columns). In FIG. 7, illustration of the via conductors 14b is partially omitted. The plurality of via conductors 14b are arrayed at regular intervals, for example, as seen from the laminating direction D. The plurality of via conductors 14b are disposed at intersection positions of lattice lines drawn at regular intervals (that is, a square lattice), for example. All of the plurality of via conductors 14b are disposed in such a way as to overlap with the connecting electrodes 9 as seen from the laminating direction D.

The arraying distances of the plurality of via conductors 14a are equal to the arraying distances of the plurality of via conductors 14b. As described above, the plurality of via conductors 14a and the plurality of via conductors 14b are disposed in such a way as to be away from each other as seen from the laminating direction D. The plurality of via conductors 14a do not overlap with the plurality of via conductors 14b and are disposed at positions horizontally away from the plurality of via conductors 14b by ½ of the arraying distances in the row direction and in the column direction as seen from the laminating direction D. In the present modification example, the arraying distances of the plurality of via conductors 13a, the arraying distances of the plurality of via conductors 13b, the arraying distances of the plurality of via conductors 14a, and the arraying distances of the plurality of via conductors 14b are equal to each other. In this manner, the via conductors 14a and the via conductors 14b are not adjacent to each other in the laminating direction D. Accordingly, even in a case where the via conductors 14a and 14b are contracted at the time of firing, disconnection of the via conductors 14a and 14b is hard to occur compared to a case where the via conductors 14a and the via conductors 14b are adjacent to each other in the laminating direction D.

Figure 9:
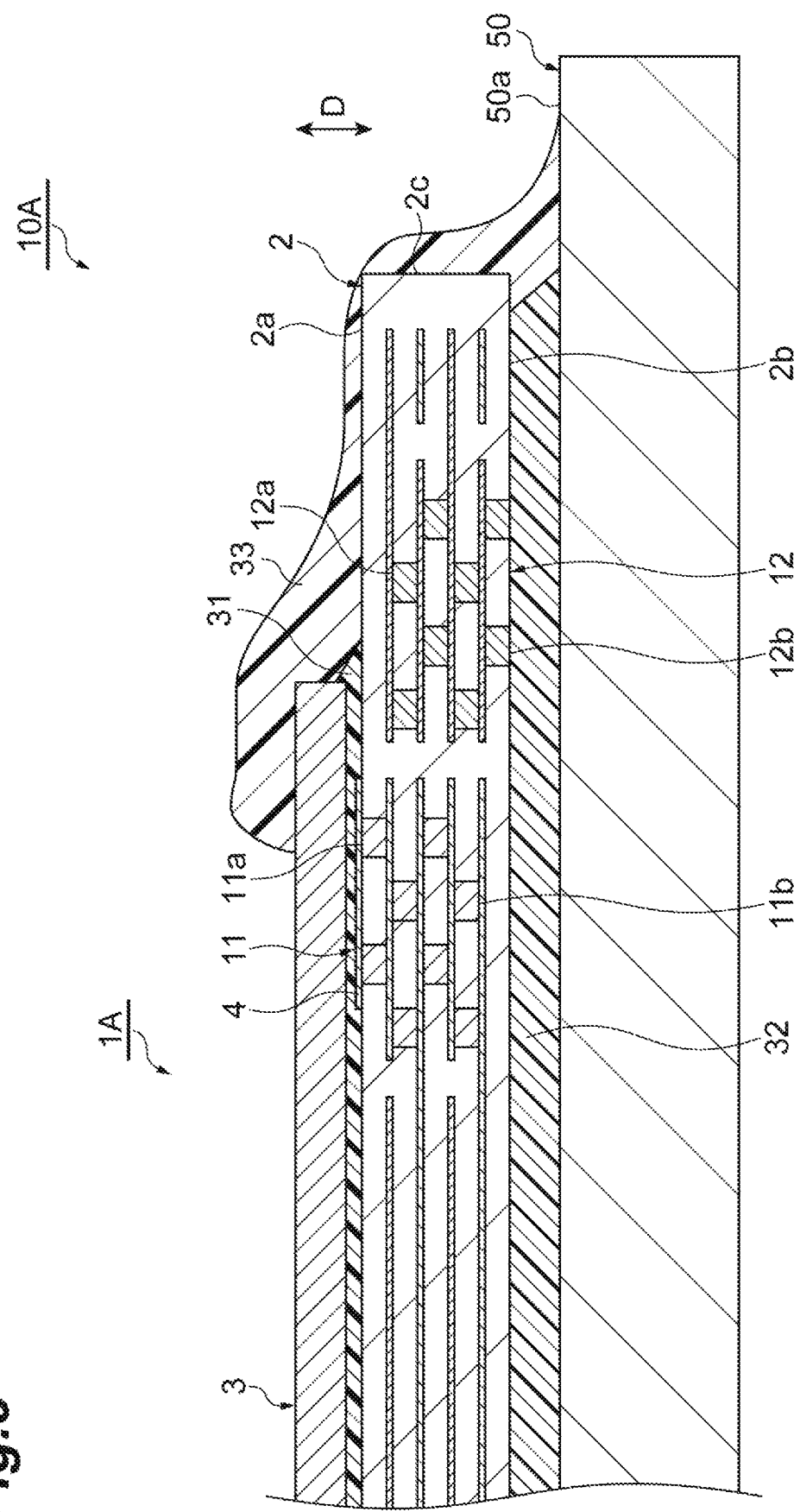
FIG. 9 is a cross-sectional view illustrating a vibrating device according to the modification example.

FIG. 9 is a cross-sectional view illustrating a vibrating device according to the modification example. As illustrated in FIG. 9, a vibrating device 10A according to the modification example mainly differs from the vibrating device 10 in that the piezoelectric element 1A is provided instead of the piezoelectric element 1 and is similar in the other respects.

In the piezoelectric element 1A and the vibrating device 10A according to the modification example, deterioration of piezoelectric characteristics can be restricted in a similar manner to a case of the piezoelectric element 1 and the vibrating device 10A. In the piezoelectric element 1A, each of the plurality of connecting conductors 11 includes the via conductor group 15a including the plurality of via conductors 13a and the via conductor group 15b including the plurality of via conductors 13b. Thus, each of the via conductors 13a and 13b can be reduced in diameter compared to a case of providing one via conductor 13. Accordingly, since the contraction amount of the via conductors 13a and 13b at the time of firing is reduced, disconnection of the via conductors 13a and 13b can be restricted. Each of the plurality of connecting conductors 12 includes the via conductor group 16a including the plurality of via conductors 14a and the via conductor group 16b including the plurality of via conductors 14b. Thus, each of the via conductors 14a and 14*b* can be reduced in diameter compared to a case of providing one via conductor 14. Accordingly, since the contraction amount of the via conductors 14*a* and 14*b* at the time of firing is reduced, disconnection of the via conductors 14*a* and 14*b* can be restricted.

In the piezoelectric element 1A, the plurality of via conductors 13*a*, 13*b*, 14*a*, and 14*b* are disposed in a matrix form as seen from the laminating direction D. Accordingly, extension of cracks along the arrangement of the plurality of via conductors 13*a*, 13*b*, 14*a*, and 14*b* is restricted further than in a case where the plurality of via conductors 13*a*, 13*b*, 14*a*, and 14*b* are disposed in line.

The piezoelectric element 1 does not need to include the external electrodes 4 or the external electrode 5. In this case, a process for forming the external electrodes 4 and 5 can be omitted, and a process for manufacturing the piezoelectric element 1 can be simplified. Similarly, the piezoelectric element 1A does not need to include the external electrode 4. In this case, a process for forming the external electrode 4 can be omitted. The piezoelectric element 1 or 1A may include one external electrode 4 covering all of the plurality of end portions 11*a*, not the plurality of external electrodes 4. The piezoelectric element 1 may include the plurality of external electrodes 5 respectively covering the plurality of end portions 12*b*. The piezoelectric element 1A may include one external electrode 5 covering all of the plurality of end portions 12*b* or the plurality of external electrodes 5 respectively covering the plurality of end portions 12*b* so that the plurality of connecting conductors 12 are electrically connected to each other with certainty.

In the piezoelectric element 1, the connecting conductor 11 may be configured to include a side electrode provided in the side surface 2*c* or the side surface 2*d* and supply electricity to the internal electrode 7 via the side electrode. In this case, since no via conductor 13 is required to be provided, the area of the internal electrode 6 can be broadened. This enables piezoelectric characteristics to be improved. The connecting conductor 12 may be configured to include a side electrode provided in the side surface 2*c* or the side surface 2*d* and supply electricity to the internal electrode 6 via the side electrode. In this case, since no via conductor 14 is required to be provided, the area of the internal electrode 7 can be broadened. This enables piezoelectric characteristics to be improved.

In the piezoelectric element 1, the via conductors 13 provided in the adjacent piezoelectric element body layers 20 in the laminating direction D may be disposed in such a way as not to overlap with each other as seen from the laminating direction D to restrict disconnection of the via conductors 13. The via conductors 14 provided in the adjacent piezoelectric element body layers 20 in the laminating direction D may be disposed in such a way as not to overlap with each other as seen from the laminating direction D to restrict disconnection of the via conductors 14.

In the vibrating device 10 or 10A, not the entire surface of the main surface 2*b* but the outer circumferential portion, the center portion, both the end portions in a direction in which the paired side surfaces 2*c* are opposed, or both the end portions in a direction in which the paired side surfaces 2*d* are opposed may be bonded to the main surface 50*a* to cause the piezoelectric element 1 or 1A to be supported by the vibrating plate 50.

What is claimed is:

1. A multilayer piezoelectric element comprising:
    a piezoelectric element body comprised of a laminated plurality of piezoelectric element body layers and including:
        a first main surface and a second main surface opposed to each other in a laminating direction of the plurality of piezoelectric element body layers; and
        a side surface extending in the laminating direction so as to connect the first main surface to the second main surface;
    a first internal electrode and a second internal electrode configured to have different polarities from each other and disposed in the piezoelectric element body opposed to each other in the laminating direction;
    a plurality of first connecting conductors extending in the laminating direction, including first end portions exposed to the first main surface, and connected to the first internal electrode;
    a plurality of second connecting conductors extending in the laminating direction, including second end portions exposed to the second main surface, and connected to the second internal electrode; and
    an external member that is conductive, bonded to the first main surface so as to cover the first end portions of the plurality of first connecting conductors, electrically connected to the plurality of first connecting conductors, and separated from an outer edge of the first main surface as seen from the laminating direction,
    wherein the plurality of first connecting conductors are only exposed from the piezoelectric element body at the first end portions, and
    the plurality of second connecting conductors are only exposed from the piezoelectric element body at the second end portions.

2. The multilayer piezoelectric element according to claim 1, wherein the second main surface is a mounting surface to be mounted on a conductive vibrating plate, and
    wherein the second end portions of the plurality of second connecting conductors are configured to be electrically connected to each other via the vibrating plate.

3. The multilayer piezoelectric element according to claim 1, further comprising:
    a first external electrode disposed on the first main surface and connected to the first end portions of the plurality of first connecting conductors,
    wherein the external member is bonded to the first main surface via the first external electrode and is electrically connected to the plurality of first connecting conductors via the first external electrode.

4. The multilayer piezoelectric element according to claim 1, further comprising:
    a second external electrode disposed on the second main surface and connected to the second end portions of the plurality of second connecting conductors.

5. The multilayer piezoelectric element according to claim 4, wherein the second external electrode includes a round corner as seen from the laminating direction.

6. The multilayer piezoelectric element according to claim 1, wherein each of the plurality of first connecting conductors or each of the plurality of second connecting conductors includes a via conductor penetrating one of the plurality of piezoelectric element body layers.

7. The multilayer piezoelectric element according to claim 1, wherein each of the plurality of first connecting conductors or each of the plurality of second connecting conductors includes a via conductor group including a plurality of via conductors penetrating one of the plurality of piezoelectric element body layers.

8. The multilayer piezoelectric element according to claim 7, wherein the plurality of via conductors are disposed in a matrix form as seen from the laminating direction.

9. The multilayer piezoelectric element according to claim 6, wherein the piezoelectric element body has a rectangular solid shape, and
   wherein the first connecting conductor and the second connecting conductor are disposed at each of corner portions of the piezoelectric element body as seen from the laminating direction.

10. A vibrating device comprising:
    the multilayer piezoelectric element according to claim 1; and
    a vibrating plate with the multilayer piezoelectric element mounted thereon,
    wherein the second main surface and the vibrating plate are opposed to each other.

11. The vibrating device according to claim 10, further comprising:
    a resin layer covering the side surface.

12. The multilayer piezoelectric element according to claim 1, further comprising:
    a bonding resin that bonds the external member to the first main surface.

13. The multilayer piezoelectric element according to claim 1, wherein each of the plurality of first connecting conductors and the plurality of second connecting conductors is surrounded by material of the piezoelectric element body.

* * * * *